United States Patent
Morich et al.

(10) Patent No.: US 10,254,360 B2
(45) Date of Patent: Apr. 9, 2019

(54) ROUTER AND COIL ARRAY FOR ULTRA HIGH FIELD MRI

(75) Inventors: Michael A. Morich, Mentor, OH (US); Zhiyong Zhai, Solon, OH (US); Eddy Y. Wong, Richmond Heights, OH (US); Kevin Nieman, Avon, OH (US); Nabeel M. Malik, Richmond Heights, OH (US)

(73) Assignee: KONINKLIJKE PHILIPS N.V., Eindhoven (NL)

(*) Notice: Subject to any disclaimer, the term of this patent is extended or adjusted under 35 U.S.C. 154(b) by 1859 days.

(21) Appl. No.: 13/808,279

(22) PCT Filed: Jul. 4, 2011

(86) PCT No.: PCT/IB2011/052950
§ 371 (c)(1),
(2), (4) Date: Jan. 4, 2013

(87) PCT Pub. No.: WO2012/004728
PCT Pub. Date: Jan. 12, 2012

(65) Prior Publication Data
US 2013/0106416 A1   May 2, 2013

Related U.S. Application Data

(60) Provisional application No. 61/362,340, filed on Jul. 8, 2010.

(51) Int. Cl.
G01R 33/36 (2006.01)
G01R 33/3415 (2006.01)
G01R 33/561 (2006.01)

(52) U.S. Cl.
CPC ..... G01R 33/3642 (2013.01); G01R 33/3415 (2013.01); G01R 33/3607 (2013.01);
(Continued)

(58) Field of Classification Search
CPC ............ G01R 33/3415; G01R 33/3607; G01R 33/3621; G01R 33/3642; G01R 33/3678; G01R 33/5612; G01R 33/3664
See application file for complete search history.

(56) References Cited

U.S. PATENT DOCUMENTS 4,695,798 A * 9/1987 Brandes ............. G01R 33/3607
324/307
6,356,081 B1  3/2002 Misic
(Continued)

FOREIGN PATENT DOCUMENTS

WO  2008104895 A1  9/2008
WO  2009102892 A1  8/2009
(Continued)

OTHER PUBLICATIONS

Near, J. P., et al.; A Six-Element Tranceive Surface Coil Array for Prostate MRI at 4.0 Tesla; 2007; Proc. Intl. Soc. Mag. Reson. Med.; 15:3256.

(Continued)

Primary Examiner — Rishi R Patel

(57) ABSTRACT

A router (60), for use with magnetic resonance systems (10), selectively routes unique excitation signals, generated by a multi-channel radio-frequency (RF) amplifier, over transmission lines (Tx) to any one of a plurality of connection panels (66) which each accepts at least one RF coil assembly having multiple coil elements (20). Each connection panel (66) includes transceiver ports (68) for connecting at least one conductor (22,24) of the coil elements (20) to a corresponding transceiver channel (T/R). The router (60) selectively routes magnetic resonance signals received by the conductors (22,24) from the transceiver channels (T/R) to a multi-channel RF receiver (41). The coin elements may carry sine-mode currents or uniform currents.

18 Claims, 5 Drawing Sheets

(52) U.S. Cl.
CPC ...... *G01R 33/5612* (2013.01); *G01R 33/3621* (2013.01); *G01R 33/3678* (2013.01)

(56) References Cited

U.S. PATENT DOCUMENTS

| | | | |
|---|---|---|---|
| 6,897,658 | B2 | 5/2005 | Belt et al. |
| 6,906,518 | B2 | 6/2005 | Leussler |
| 7,348,776 | B1 | 3/2008 | Aksoy et al. |
| 7,545,966 | B2 | 6/2009 | Lewin et al. |
| 7,619,416 | B2 | 11/2009 | Nordmeyer-Massner et al. |
| 7,663,367 | B2 | 2/2010 | Wiggins |
| 7,915,892 | B2 | 3/2011 | Okamoto |
| 2002/0180442 | A1 | 12/2002 | Vij |
| 2005/0156598 | A1 | 7/2005 | Matschl et al. |
| 2007/0282194 | A1 | 12/2007 | Wiggins et al. |
| 2008/0088305 | A1* | 4/2008 | Olson .................. G01R 33/246 324/309 |
| 2008/0129298 | A1 | 6/2008 | Vaughan et al. |
| 2008/0218168 | A1* | 9/2008 | Takagi ............... G01R 33/3664 324/309 |
| 2008/0272783 | A1 | 11/2008 | Okamoto |
| 2008/0290870 | A1 | 11/2008 | Misic |
| 2009/0087057 | A1 | 4/2009 | Parker et al. |
| 2009/0130885 | A1 | 5/2009 | Hagen et al. |
| 2009/0134876 | A1* | 5/2009 | Griswold ........... G01R 33/3415 324/318 |
| 2010/0026303 | A1 | 2/2010 | Zhai |

FOREIGN PATENT DOCUMENTS

| | | |
|---|---|---|
| WO | 2009134920 A2 | 11/2009 |
| WO | 2010065095 A2 | 6/2010 |

OTHER PUBLICATIONS

Ohliger, M. A., et al.; Concentric Coil Arrays for Spatial Encoding in Parallel MRI; 2001; Proc. Intl. Soc. Mag. Reson. Med.; 9:21.

* cited by examiner

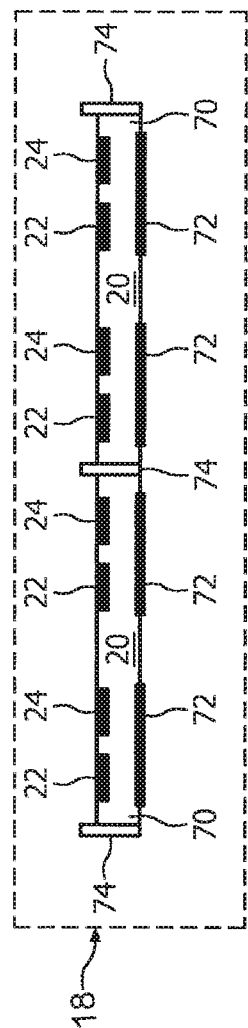
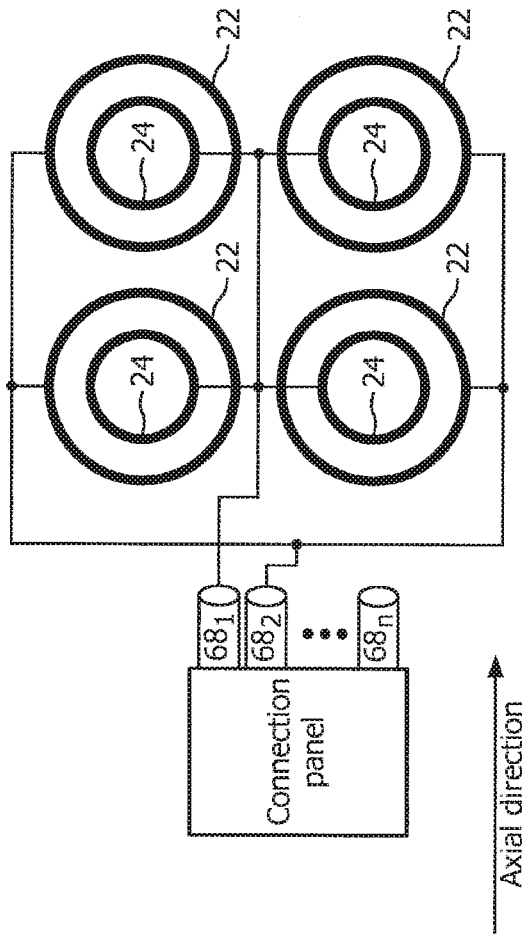
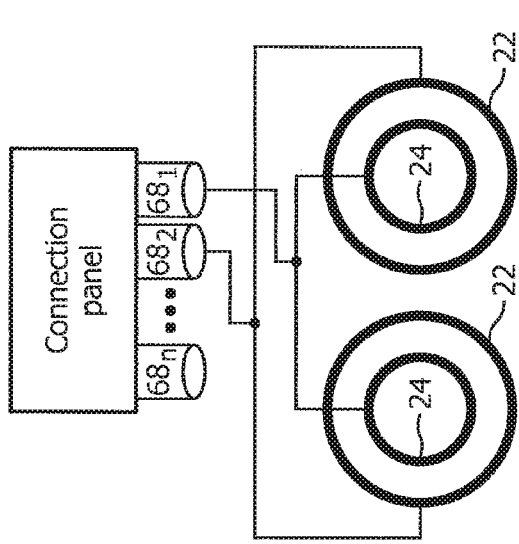
FIG. 3A
FIG. 3C
FIG. 3B

ROUTER AND COIL ARRAY FOR ULTRA HIGH FIELD MRI

CROSS REFERENCE TO RELATED APPLICATIONS

This application is a national filing of PCT application Serial No. PCT/IB2011/052950, filed Jul. 4, 2011, published as WO 2012/004728 A2 on Jan. 12, 2012, which claims the benefit of U.S. provisional application Ser. No. 61/362,340 filed Jul. 8, 2010, which is incorporated herein by reference.

The present application relates to the magnetic resonance arts. It finds particular application in magnetic resonance imaging at ultra high fields, e.g. at 3 Tesla and higher, such as 7 Tesla and 9.4 Tesla. However, the following finds more general application in magnetic resonance imaging, and magnetic resonance spectroscopy, and the like.

Magnetic resonance imaging (MRI) and spectroscopy (MRS) systems are often used for the examination and treatment of patients. By such a system, the nuclear spins of the body tissue to be examined are aligned by a static main magnetic field $B_0$ and are excited by transverse magnetic fields $B_1$ oscillating in the radiofrequency band. In imaging, relaxation signals are exposed to gradient magnetic fields to localize the nuclear spins. The relaxation signals are received in order to form in a known manner a single or multi-dimensional image. In spectroscopy, information about the composition of the tissue is carried in the frequency component of the resonance signals.

An RF coil system provides the transmission of RF signals and the reception of resonance signals. In high field MR systems, for example 3 Tesla or higher, some characteristics, such as dielectric loading and conductivity of the subject, dominate the $B_1$ field non-uniformity more so than at lower field strengths. The result is a decrease in image uniformity, contrast, and a spatially dependent signal-to-noise ratio which consequently reduces the quality of acquired images. To address this problem, several design considerations to improve RF coil performance have been proposed, such as multiple independent transmit and receive channels to enact $B_1$ coil shimming. Generating a $B_1$ excitation field with a clinically acceptable degree of uniformity with shimming generally requires approximately 8 or more independent channels at ultra high fields. Systems of such increased complexity exist in research settings; however, the power requirements are cost prohibitive for clinical settings.

Another design consideration is the use of local surface coils to reduce the power demand for independent transmit channels. These systems use local surface coils for excitation and reception. During imaging procedures at ultra high fields, multiple transmit and receive (T/R) coils at multiple locations are used requiring an operator to disconnect and reconnect the various surface coils to the various amplifiers manually which can add to imaging time and disrupt workflow.

There exists a desire for simple and flexible coil interfaces with multiple connection points for high field imaging systems which can preserve the use of existing coils and expand the use of multiple T/R coils. The present application provides a new and improved interconnectivity for multiple coil combinations which overcomes the above-referenced problems and others.

In accordance with one aspect, a magnetic resonance (MR) system is presented. The MR system includes a radio-frequency (RF) amplifier which generates a unique $B_1$ excitation signal for each one of a plurality of transmission channels. The MR system includes at least one RF coil assembly which has multiple coil elements. The coil elements transmit the generated excitation signal into an examination region and receive magnetic resonance signals therefrom. A plurality of connection panels each connect the RF amplifier to the at least one RF coil assembly via transceiver ports located at each connection panel. Each transceiver port connects at least one conductor of a coil element to an individual transmission channel. A router selectively routes a generated excitation signal via a corresponding transmission channel to at least one of the transceiver ports of any of the plurality of connection panels.

In accordance with another aspect, a method for magnetic resonance is provided. The method comprises generating a unique excitation signal for each of a plurality transmission channels of a radio-frequency (RF) amplifier. The generated excitation signals are transmitted into an examination region and received magnetic resonance signals therefrom with multiple coil elements of at least one RF coil assembly. The RF amplifier is connected to the at least one RF coil assembly via transceiver ports of one of a plurality of connection panels, each transceiver port connecting at least one conductor to an individual transmission channel. A generated excitation signal is selectively routed via a corresponding transmission channel (Tx) to at least one transceiver port of any of the plurality of connection panels.

In accordance with another aspect, a coil element which includes at least two conductors is presented. The coil elements operate in distinct resonant modes to generate a pair orthogonal $B_1$ magnetic fields and to receive magnetic resonance signals at corresponding resonant frequencies in an examination region.

One advantage is that transverse magnetic field uniformity is improved.

Another advantage is that image uniformity, image contrast, and signal-to-noise ratio are improved.

Another advantage is that workflow is improved.

Still further advantages of the present invention will be appreciated to those of ordinary skill in the art upon reading and understanding the following detailed description.

The invention may take form in various components and arrangements of components, and in various steps and arrangements of steps. The drawings are only for purposes of illustrating the preferred embodiments and are not to be construed as limiting the invention.

FIGS. 3A-3G are diagrammatic illustrations of various embodiments of the dual mode coil assembly.

Figure 1:
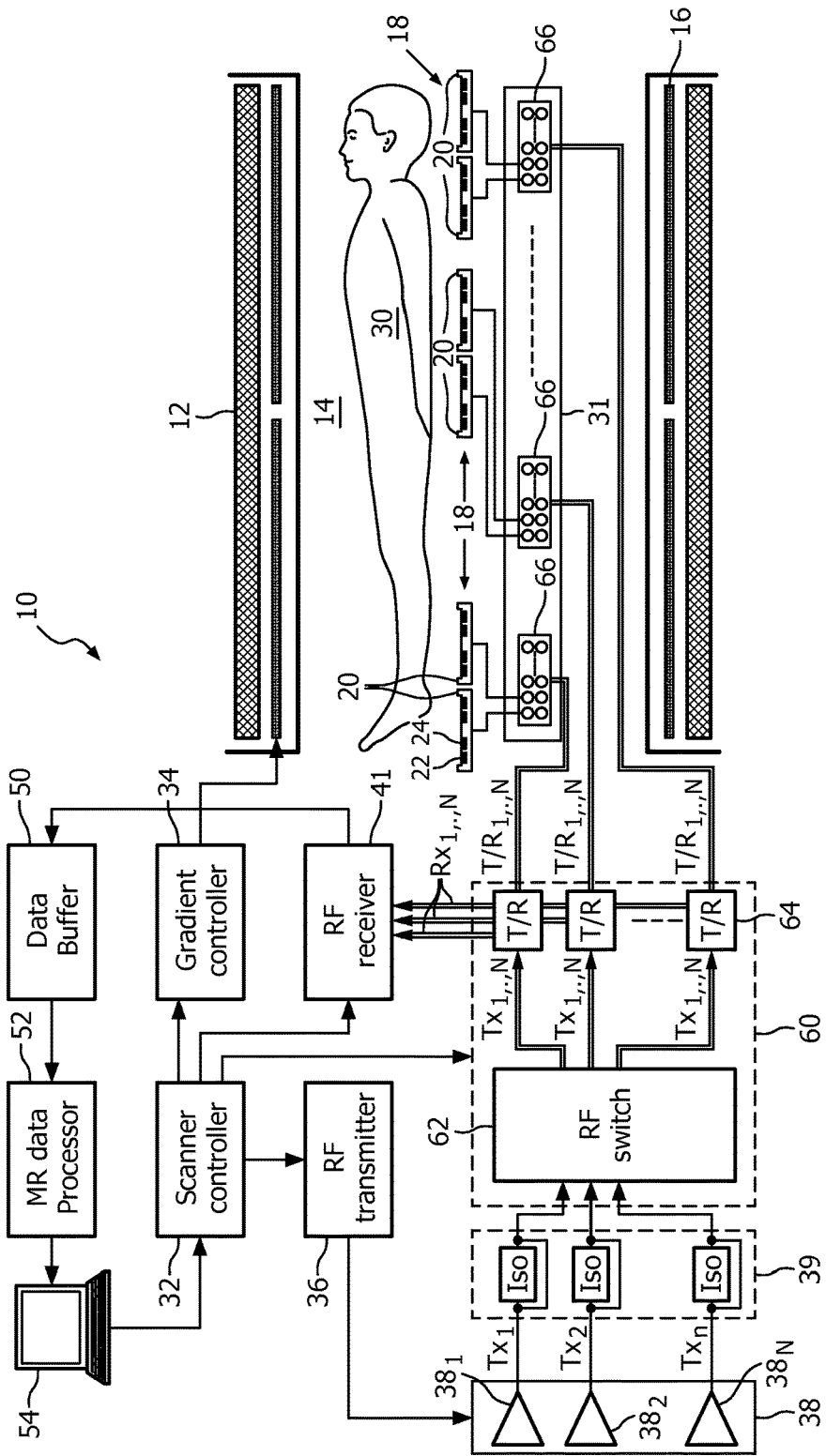
FIG. 1 is diagrammatic illustration of a magnetic resonance system including a router and dual mode transmit and receive coils assemblies.

With reference to FIG. 1, a magnetic resonance (MR) imaging system 10 includes a main magnet 12 which generates a spatial and temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially encoding magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

The system 10 includes a plurality of radio-frequency (RF) coil assemblies 18 disposed in or adjacent to the examination region 14. Although illustrated below the patient, head coils, flexible and rigid surface coils, and other coils that are mounted on upper and side surfaces of the patient, that wrap around the torso or limbs, and the like are also contemplated. Each coil assembly 18 includes a multiple coil elements 20 which, during operation, alone or collectively generate radio frequency fields for exciting magnetic resonance in one or more nuclear species, such as $^1$H, $^{13}$C, $^{31}$P, $^{23}$Na, $^{19}$F, or the like. The radio-frequency coil assemblies 18, alone or collectively, also serve to detect magnetic resonance signals emanating from the imaging region.

In one embodiment, each coil element 20 includes at least two conductors: a single sine-mode conductor 22 and at least one uniform-mode conductor 24. The sine-mode conductor 22 is an annular conductor tuned to a resonant mode which has a sinusoidal current distribution along the corresponding conductor to generate a first $B_1$ magnetic field directed parallel with the plane of the conductor 22. The uniform-mode conductor 24 in one embodiment is an annular conductor tuned to a resonant mode which has a uniform current distribution along the corresponding conductor to generate a second $B_1$ magnetic field directed out-of-plane with the conductor 24. In the illustrated embodiment, the plane of the conductors 22, 24 are parallel with the direction of the main magnetic field $B_0$. In this arrangement, each coil element 20 acts as a quadrature surface coil which generates excitation magnetic fields in the two directions orthogonal to the $B_0$ field. This dual-mode configuration advantageously improves $B_1$ field homogeneity and efficiency which consequently improves sensitivity and signal-to-noise ratios, especially during high-field magnetic resonance studies, such as at 3 Tesla or higher. See for example Zhai, International Application No. WO 2008/104895.

It should be noted that a sine-mode conductor, though applicable, is more practical for field strengths greater than 3T, e.g. 7T. In another embodiment in which operates the main magnet 12 operates at 3T, each coil element 20 includes a quadrature shaped uniform-mode conductor 24. The quadrature uniform mode conductor 24 is a quadrature coil, such as a butterfly coil, figure-eight coil, or the like, which operates with a uniform current distribution to generate a pair of B1 excitation magnetic fields in the two directions orthogonal to the $B_0$ field. In this embodiment, the sine-mode conductor 22 is not necessary because the quadrature uniform-mode conductor 24 generates the pair of orthogonal excitation magnetic fields.

In another embodiment, each coil element 20 includes a loop-shaped uniform-mode conductor 24. The loop-shaped uniform-mode conductor 24 is an annular conductor tuned to a resonant mode which has a uniform current distribution along the corresponding conductor to generate a $B_1$ magnetic field directed out-of-plane with the conductor 24. The plane of the conductors 24 is parallel with the direction of the main magnetic field $B_0$. To acquire magnetic resonance data of a subject 30, the subject is positioned inside the examination region 14 by a patient support 31, with a region of interest preferably at or near the isocenter of the main magnetic field. A scan controller 32 controls a gradient controller 34 which causes the gradient coils 16 to apply the selected magnetic field gradient pulses across the imaging region, as may be appropriate to a selected magnetic resonance imaging or spectroscopy sequence. The scan controller 32 also controls one or more RF transmitters 36 to generate unique radio-frequency signals to an array of RF amplifiers 38 including individual amplifiers $38_1, \ldots, 38_N$, each of causes one or more conductors 22, 24 of the local coils to generate the magnetic resonance excitation and manipulation $B_1$ pulses. Each RF amplifier 38 amplifies the generated unique excitation signal which is transmitted to one or more conductors 22, 24 over one or more transmit channels Tx. Rather than one or more multi-channel transmitters which has a channel connected to a corresponding amplifier 38 as illustrated, an array of independent transmitters is provided in which each transmitter can be connected to a corresponding transmit channel Tx.

In the MR system, one or more amplifiers are dedicated to broadband excitation used primarily for multi-nuclear (non-proton) imaging or multi-nuclear (non-proton) spectroscopy and one or more are dedicated to narrowband excitation which is used primarily for proton MR imaging or spectroscopy. To improve system flexibility, each RF amplifier is configured to transmit a broadband excitation signal to excite a wide range of nuclear species or one or multiple single nuclear species simultaneously. An in-line isolator 39 limits the broadband signal to a narrowband excitation signal for each transmit channel Tx. A bypass 40, selectively controlled by the scanner controller 32, bypasses the isolator when a broadband imaging or spectroscopy procedure is prescribed.

The scan controller also controls an RF receiver 41 which is connected to the conductors 22, 24 to receive the generated magnetic resonance signals therefrom. The received signals are transmitted from the conductors 22, 42 to the receiver 41 via one or more receive channels Rx. Receive signal pre-amplification may be incorporated into the coil assembly 18 or in a transceiver switch 64, which will be later described. Likewise, the system 10 may include independent receiver, each connected to a corresponding receive channel Rx. It should be noted that the number of receive channels Rx do not have to correspond to the number of transmit channels Tx. Alternatively, a receive channel multiplexer, disposed prior to the receiver 41, can be used where the number of receive channels Rx is greater than the number of available receivers 41.

The received data from the receiver 41 is temporarily stored in a data buffer 50 and processed by a magnetic resonance image, spectroscopy, or other data processor 52. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface or display device 54 includes a user input device which a clinician can use for controlling the scan controller 32 to select scanning sequences and protocols, display MR data, and the like.

Figure 2:
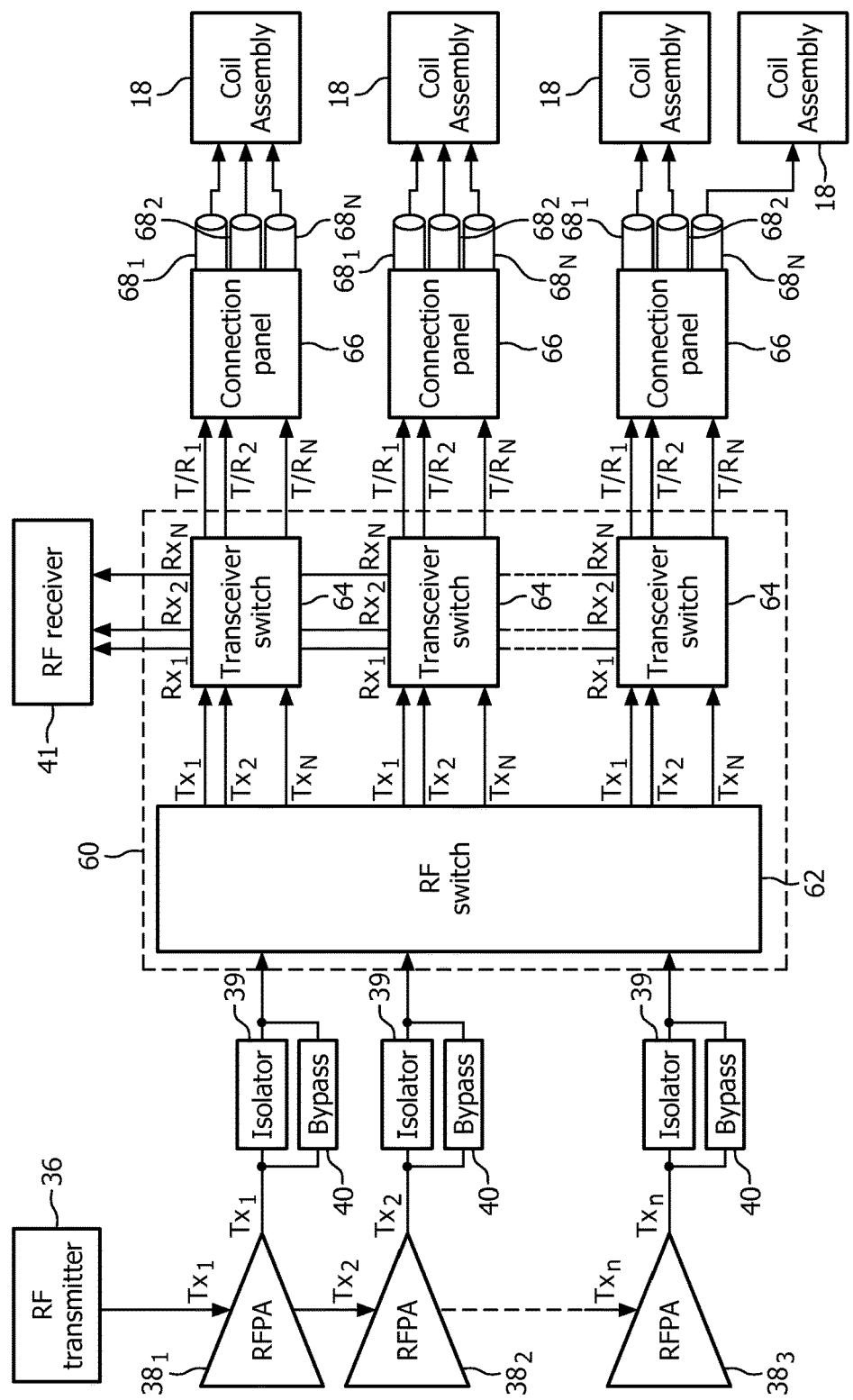
FIG. 2 is a diagrammatic illustration of one embodiment of the router of FIG. 1.

With reference to FIG. 2, a router 60 selectively routes each transmit channel Tx, and consequently the excitation signal which is transmitted via the corresponding transmit channel Tx, to one or more of the various conductors 22, 24 of any of the plurality of coil assemblies 18. The router 60 provides a flexible interface between the coil assemblies 18 and the RF transmitter 36 for selecting various combinations of the conductors 22, 24 and the coil assemblies 18 with various amplifiers 38 during excitation. The router includes an RF switch 62 that routes the amplifier outputs, i.e. the transmit channels Tx, to one of a plurality of transceiver switches 64. In other worlds, the router 60 also serves to switch the conductors between signal transmission and signal reception. During signal transmission, a transceiver switch 64 selectively switches the transmit channels Tx into communication with transceiver channels T/R that correspond to the transceiver switch 64. Alternatively, during signal reception a transceiver switch 64 selectively switches the transceiver channels T/R into communication with receiver channels Rx that correspond to the transceiver switch 64. The receive channel multiplexer may be integrated into the router 60 or externally prior to the receiver 41, as previously described, to multiplex the receive channels when the number of available receivers 41 is less than the number of receive channels Rx. Each transceiver switch 64 is operatively connected to a connection panel 66 which receives at least one coil assemblies 18. As illustrated, the connection panels are integrated into the patient support 31. However, other arrangements are also contemplated, such as integrating the panel 31 into a housing which surrounds the main magnetic 12 or the like. The connection panels include a plurality of connection ports 68 which removably receives a connection for at least one conductor 22, 24. The number of available connection ports 68 per panel 66 may coincide with the number of transmission channels Tx. However, less or more ports 68 are also contemplated.

Having multiple connection panels 66 in the system 10 permits the user to select various multiple local coil assemblies 18 and combinations thereof at arbitrary locations, i.e. connection panels 66 and/or connection ports 68, in the examination region to obtain the desirable field of view or different anatomy coverage without having to reposition a single coil assembly for different imaging procedures. For example, a clinician may attach a coil assembly 18 configured for multi-nuclear magnetic resonance at a first connection panel 66 and a coil assembly 18 configured for proton magnetic resonance at a second connection panel 66. Several other configurations of coil assemblies 18 are contemplated, for example two coil assemblies 18, capable of both transmit and receive functions, can be each arranged for local proton magnetic resonance of both patient knees. Similarly, two coil assemblies 18, capable of both transmit and receive functions, can be arranged for local breast magnetic resonance. Other examples include, but not limited to, multiple local coil assemblies 18, capable of both transmit and receive functions, arranged for imaging or spectroscopy of the head, neck, spine, or the like.

The scanner controller 32 controls a first bypass to transmit a broadband signal to the first connection panel and control a second bypass to transmit a narrowband signal to the second connection panel. The scanner controller 32 then controls the router to the route the excitation signals to the corresponding conductor or conductors 22, 24. In one embodiment, the clinician manually inputs at the GUI 54 the coil type and the selected connection ports 22, 24 for the imaging procedure. In another embodiment, each coil elements includes an identification module which carries information regarding the coil type. The scanner controller 32 automatically detects the information in the module and the port or ports 68 to which it is connected to and configures the router 60 and bypasses 40 accordingly.

Figure 3D:
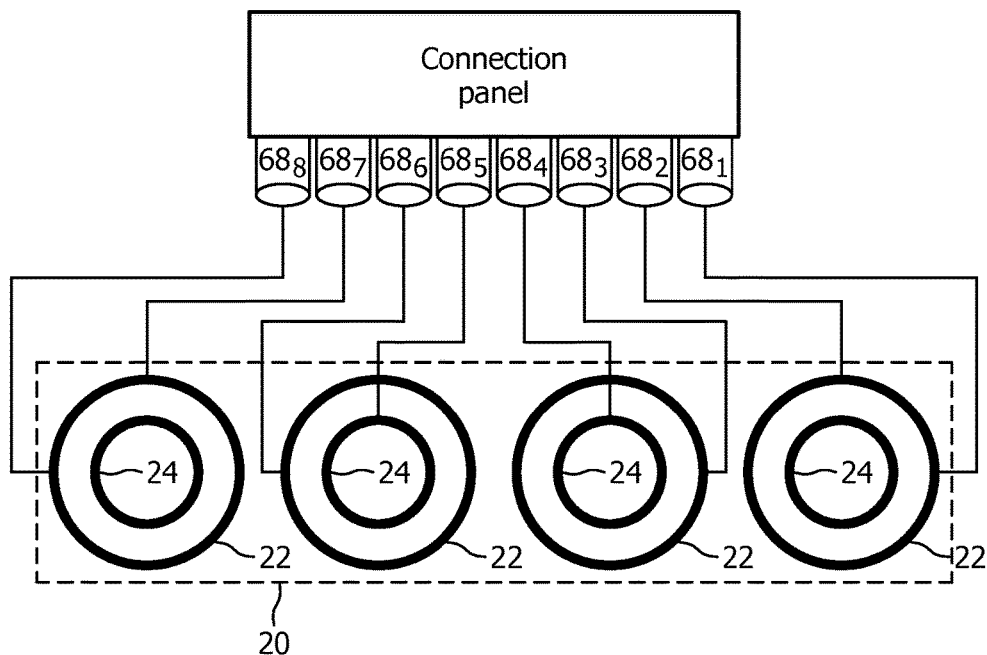

FIGS. 3A-3F illustrate various embodiments of dual mode coil assemblies in greater detail. With reference to FIG. 3A, a cross-sectional view of one embodiment of a two-element coil assembly 18 is illustrated in greater detail. As previously described, each coil element 20 includes two concentric annular flat conductors 22, 24. The outer conductor 22 is a sine-mode conductor and the inner conductor is a uniform-mode conductor 24. For 7 Tesla MR systems operating at 298 MHz, an effective mean diameter is 17 cm for the sine-mode conductor 22 and 13 cm for the uniform-mode conductor 24 and the separation between adjacent sine-mode conductors 22 is 1 cm. It should be noted that other diameters and annular coil geometries for the conductors are contemplated, such as elliptical or polygonal like pentagonal, hexagonal, square, or the like, as are linear coils. In addition, the coil may be rigid, flexible, flat, contour, or any combination thereof, or the like. The size and shape of the coil element 20 can be selected based to the desired excitation frequency and field of view. The conductors are supported by a dielectric layer 70 and opposite the conductors 22, 24 are RF shielding 72 to shield the conductors 22, 24 and various power, control, communication, gating, receive/transmit channels, or the like from one another. To improve isolation from neighboring coil elements 20, the conductors are countersunk within the dielectric layer 70. Optionally, the RF shielding 74 may extend around a periphery of the dielectric layer. Note that assemblies 18 with greater than two coil elements 20 are also contemplated such as those illustrated in FIGS. 3C and 3D which will be discussed in greater detail.

With reference to FIGS. 3B and 3C, in one embodiment, the uniform-mode conductors 24 are connected to a first connection port $68_1$ and the sine-mode conductors 22 are connected to a second connection port $68_2$. In this power-sharing arrangement, all of the sine-mode conductors 22 share a first excitation signal which is routed to the first connection port $68_1$, while all of the uniform-mode conductors 24 share a second excitation signal which is routed to the second connection port $68_2$. Rather than the like mode the conductors sharing a single connection port 68 as illustrated, the router 60 can split the power at the RF switch 62 such that a single transmit channel Tx is shared between two or more connection ports 68.

Figures 3E, 3F:
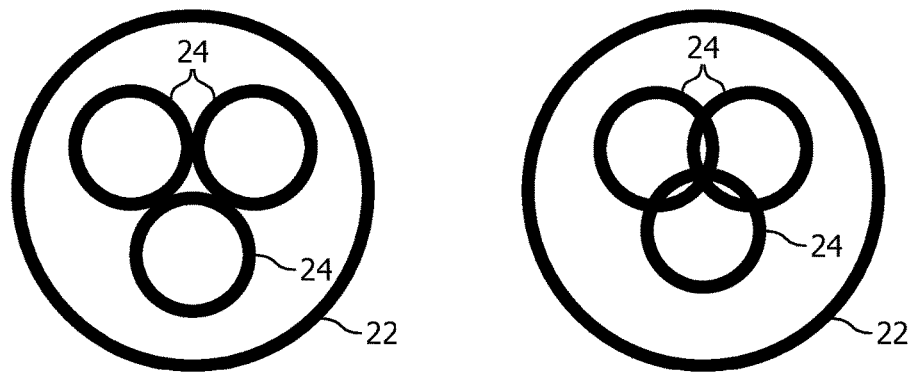
Figure 4D:
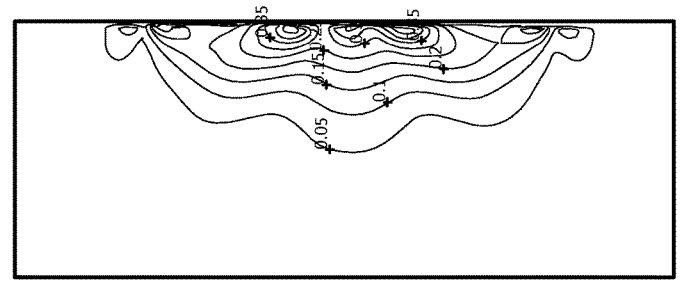
FIGS. 4A-4D are $B_1$ plots of some various embodiments of the dual mode coil assembly.
Figure 4C:
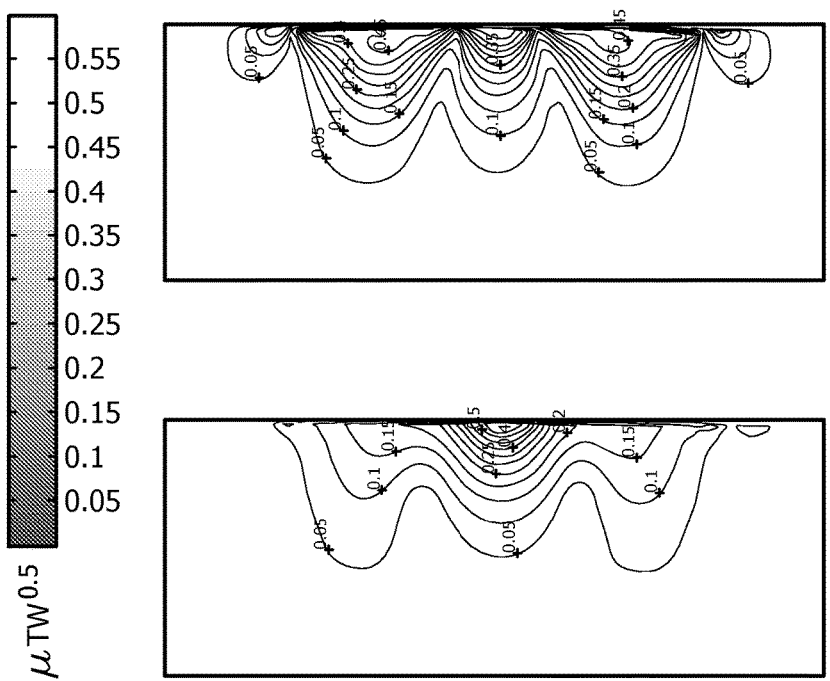
Figure 4B:
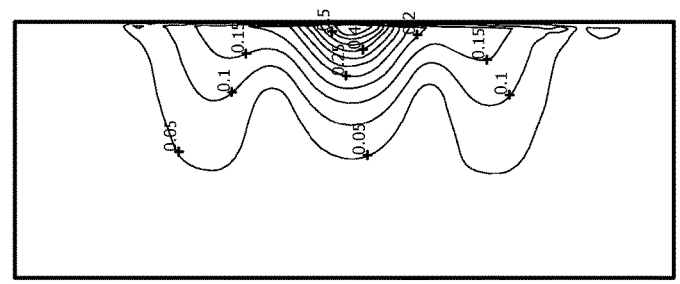
Figure 4A:
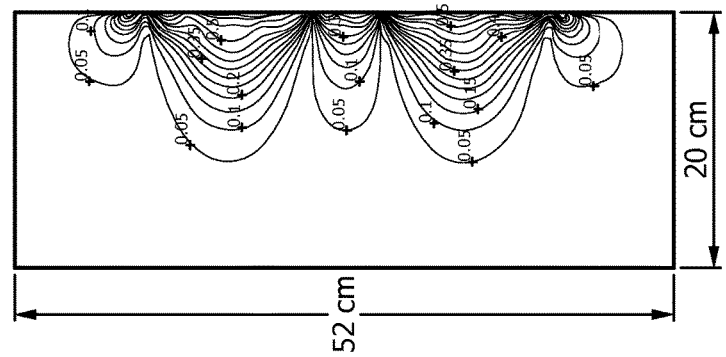

With reference to FIG. 3D, in another embodiment, the conductors can be operated in an independent arrangement where each conductors is connected to an independent transmit channel Tx. The router 60 routes the each output from the amplifiers 38 to a unique connection ports 68 of a selected connection panel 66. This arrangement is useful for shimming the $B_1$ excitation field to ensure maximum coverage while maintaining a uniform field. The coil assemblies can be oriented parallel or orthogonal along an axial axis of the patient based on the desired field of view. It should be noted that the coil elements 20 can be used as a conventional multi-loop array by disconnecting the sine-mode conductors 22 such that they are not used, and routing an excitation signal only to the uniform-mode conductors 24. With reference to FIGS. 3E and 3F, in another embodiment, each coil element 20 includes more than one uniform-mode conductors 24, such as two, three, or greater. The diameter of the uniform-mode conductors 24 is reduced to fit within a surrounding sine-mode conductor 22. However, a minimum size should be maintained to avoid compromising the penetration depth of the $B_1$ field. The uniform-mode conductors can be arranged adjacent to one another, such as in FIG. 3E, or they can be overlapped, as in FIG. 3F, to improve shimming and isolation from adjacent coil elements. The amount of overlap can be selected to minimize mutual inductance. FIGS. 4A-4D illustrate examples of the $|B_1+|$ field in a sagittal plane of a phantom using an axially arranged two-element coil assembly. In the plots, the $|B_1+|$ values are scaled to 1 W of total absorbed average power in the phantom. FIG. 4A depicts the $|B_1+|$ field in µT of a first example where the router 60 routes a generated excitation signal to a single connection port 68 to which the uniform-mode conductors 24 are attached in power sharing configuration. In a second example, FIG. 4B depicts the |B₁+| field of the sine-mode conductors 22 sharing power from a single transmit channel Tx. In a third example, FIG. 4C depicts the |B₁+| field of all the conductors 22, 24 sharing power from a single transmit channel Tx. The sine-mode conductors 22 are connected to a first connection port 68 and the uniform-mode conductors 24 are connected to a second connection port 68. The router routes the same RF power to the two connectors but with a 90° phase difference. In a fourth example, FIG. 4D depicts the |B₁+| field of like mode conductors sharing power from a single transmit channel Tx, i.e. the sine mode conductors 22 are connected to a first connection port 68 and the uniform mode conductors are connected to a second connection port 68. The router then routes unique excitation signals to each of the two connection ports 68. In this example a voltage ratio of the uniform mode conductors to the sine-mode conductors of 0.5V and a phase difference of 10° was used. The improvement is seen in the uniformity of the |B₁+| field along the axial direction near the phantom surface.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A magnetic resonance system, comprising:
    an array of radio-frequency (RF) amplifiers each configured to generate a broadband RF signal for each of a plurality of transmission channels (Tx), each transmission channel including a broadband/narrow band selection means for controllable passing one of a narrow band of the broadband RF signal or the broadband RF signal, wherein the broadband/narrow band selection means includes:
        an isolator configured to pass the narrow band of the broadband RF signal from a corresponding RF amplifier; and
        a bypass configured to selectively bypass the corresponding isolator to pass the broadband signal;
    a plurality of RF coil elements configured to transmit the broadband RF signals or the narrow band RF signals into an examination region and receive magnetic resonance signals therefrom;
    a plurality of connection panels each including a plurality of transceiver ports, each transceiver port removably connecting with at least one coil conductor of the plurality of RF coil elements;
    a router configured to selectively route the broadband or narrow band RF signals via a corresponding one of the transmission channels (Tx) to at least a selected one of the transceiver ports of any selected one of the plurality of connection panels; and
    a scan controller configured to control the bypass to switch between (a) bypassing the isolator and passing the broadband signal to the router and (b) not bypassing the isolator such that the narrow band of the signal is passed to the router and control the router to deliver a selected magnetic resonance sequence to each removably connected RF coil element.

2. The magnetic resonance system according to claim 1, wherein the at least one coil conductor operates in a uniform current resonant mode to generate a pair of orthogonal B₁ magnetic fields and to receive magnetic resonance signals at corresponding resonant frequencies in an examination region.

3. The magnetic resonance system according to claim 1, wherein each coil element has at least two conductors which operate in distinct resonant modes to generate a pair of orthogonal B₁ magnetic fields and to receive magnetic resonance signals at corresponding resonant frequencies in an examination region.

4. The magnetic resonance system according to claim 2, wherein each RF coil element includes at least one of:
    (i) at least one sine-mode conductor tuned to a sinusoidal current resonant mode which generates a first B₁ magnetic field directed parallel to a plane of the conductor; and
    (ii) at least one uniform-mode conductor tuned to a uniform current resonant mode which generates a second B₁ magnetic field directed out of the plane of the conductor.

5. The magnetic resonance system according to claim 4, wherein each RF coil element includes:
    one of a pair of annular, generally co-planar conductors in which the uniform-mode conductor is arranged concentric to the sine-mode conductor; and
    a plurality of annular, generally co-planar conductors in which at least two uniform-mode conductors are surrounded by the sine-mode conductor.

6. The magnetic resonance system according to claim 4, wherein:
    the sine-mode conductors share a broadband or narrow band RF signal from a first of the transmission channels (Tx) and the uniform-mode conductors share a broadband or narrow band RF signal from a second of the transmission channels (Tx); or
    each conductor receives a broadband or a narrow band RF signal from an independent transmission channel.

7. The magnetic resonance system according to claim 1, wherein the router includes:
    an array of transceiver switches, each corresponding to a single transceiver port, which selectively switches each transceiver port between a transmission channel (Tx) and a receive channel (Rx).

8. The magnetic resonance system according to claim 7, wherein the router further includes:
    an RF switch which selectively switches each transmission channel (Tx) between a selected one of the plurality of transceiver switches.

9. A method for magnetic resonance, comprising:
    generating a unique broadband excitation signal for each of a plurality of transmission channels with each radio-frequency (RF) amplifier of an array of RF amplifiers, each transmission channel including an isolator configured to pass only a narrow band of the broadband excitation signal and a bypass configured to bypass the isolator and pass the broadband excitation signal;
    transmitting the generated excitation signals into an examination region and receiving magnetic resonance signals therefrom with a plurality of RF coil elements, each RF coil element including at least one conductor;
    connecting each RF amplifier to a selected one of the RF coil elements via transceiver ports of one of a plurality of connection panels, each transceiver port connecting the at least one conductor of the RF coil elements to an individual transmission channel with a router; and
    with a scan controller, controlling the bypasses to selectively between (a) bypassing the isolator and passing the broadband signal via a corresponding, transmission channel (Tx) to a selected transceiver port of the plurality of connection panels and (b) not bypassing the isolator such that the narrow band excitation signal is passed via a corresponding transmission channel (Tx) to a selected transceiver port of the plurality of connection panels.

10. The method according to claim 9, wherein the at least one conductor operates in a uniform current resonant mode to generate a pair of orthogonal $B_1$ magnetic fields and to receive magnetic resonance signals at corresponding resonant frequencies in an examination region.

11. The method according to claim 9, wherein each RF coil element has at least two conductors operating in distinct resonant modes to generate a pair orthogonal $B_1$ magnetic fields and to receive magnetic resonance signals at corresponding resonant frequencies.

12. The method according to claim 11, wherein each RF coil element includes:
   (i) a sine-mode conductor tuned to a sinusoidal current resonant mode which generates a first $B_1$ magnetic field directed parallel to a plane of the conductor; and
   (ii) at least one uniform-mode conductor tuned to a uniform current resonant mode which generates a second $B_1$ magnetic field directed out of plane of the conductor.

13. The method according to claim 12, wherein each RF coil element includes one of:
   a pair of annular, generally co-planar conductors in which the uniform-mode conductor is arranged concentric to the sine-mode conductor; and
   a plurality of annular, generally co-planar conductors in which at least two uniform-mode conductors are surrounded by the sine-mode conductor.

14. The method according to claim 12, wherein:
   the sine-mode conductors of at least two of the RF coil elements share an excitation signal from a first transmission channel (Tx) and the uniform-mode conductors of the at least two of the RF coil elements share an excitation signal from a second transmission channel (Tx); or
   each conductor receives an excitation signal from an independent transmission channel (Tx).

15. A magnetic resonance system comprising:
   an array of radio frequency (RF) amplifiers each configured to generate broadband RF signals for each of a plurality of transmission channels (Tx), wherein each transmission channel includes:
      an isolator configured to pass a narrow band of the broadband RF signal from the corresponding RF amplifier; and
      a bypass configured to selectively bypass the corresponding isolator to pass the broadband signal;
   a plurality of different types of quadrature RF coil elements configured to transmit the broadband or narrow band signal into an examination region and receive magnetic resonance signals therefrom, each coil element including at least two coil conductors configured to generate orthogonal $B_1$ magnetic fields and to receive magnetic resonance echo signals induced by the $B_1$ magnetic fields, the RF coil elements having differing sizes, shapes, resonance frequencies, and fields of views;
   a plurality of connection panels, each connection panel configured to removably connect any one of the RF coil elements to one of the transmission channels via connector ports, each connector port removably connecting one of the conductors of the RF coil element to one of the transmission channels;
   a router configured to selectively route each generated broadband or narrow band signal from the corresponding transmission channel (Tx) to at least a selected one of the connector ports of any selected one of the plurality of connection panels; and
   a scan controller configured to control the bypass to switch between (a) bypassing the isolator and passing the broadband signal to the router and (b) not bypassing the isolator such that the narrow band of the signal is passed to the router and control the router to deliver a selected magnetic resonance sequence to each removably connected RF coil element.

16. The magnetic resonance system according to claim 15, further including:
   a magnet which generates a static magnetic field in an examination region;
   a radio-frequency receiver which receives the generated magnetic resonance signals from the radio-frequency coil assembly; and
   a scanner controller which controls the RF amplifier, the router, and the bypass according to a selected magnetic resonance sequence.

17. The magnetic resonance system according to claim 15, wherein the RF coil elements include one or more of:
   a sine-mode conductor tuned to a sinusoidal current resonant mode which generates a first $B_1$ magnetic field directed parallel to a plane of the conductor and at least one uniform-mode conductor tuned to a uniform current resonant mode which generates a second $B_1$ magnetic field directed out of plane of the conductor;
   a pair of annular, generally co-planar conductors in which a uniform-mode conductor is arranged concentric to a sine-mode conductor;
   a plurality of annular, generally co-planar conductors in which at least two uniform-mode conductors are arranged concentric to a sine-mode conductor;
   a plurality of annular uniform-mode conductors adjacent to one another surrounded by an annular sine-mode conductor; and
   a plurality of annular uniform-mode conductors partially overlapping one another surrounded by an annular sine-mode conductor.

18. The magnetic resonance system according to claim 15, wherein:
   each RF coil element includes an identification module which carries information regarding coil element type; and
   the scan controller is further configured to detect the information of each of the RF coil elements connected to each of the connection panels, the connector port to which each of the coil elements of each of the connected RF coil elements is connected, and to control the RF amplifiers, the bypass, and the router to deliver the selected magnetic resonance sequence to each removably connected RF coil element based on the information from the identification module.

* * * * *